(12) United States Patent
Tews et al.

(10) Patent No.: US 7,157,328 B2
(45) Date of Patent: Jan. 2, 2007

(54) SELECTIVE ETCHING TO INCREASE TRENCH SURFACE AREA

(75) Inventors: Helmut Horst Tews, Munich (DE); Stephan Kudelka, Ottendorf-Okrilla (DE); Kenneth T. Settlemyer, Poughquag, NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 41 days.

(21) Appl. No.: 11/047,312

(22) Filed: Jan. 31, 2005

(65) Prior Publication Data

US 2006/0172486 A1   Aug. 3, 2006

(51) Int. Cl.
*H01L 21/8242* (2006.01)

(52) U.S. Cl. ............... 438/243; 438/244; 438/245; 438/246; 438/247; 438/248; 438/249; 438/386; 438/387; 438/388; 438/389; 438/390; 438/391; 438/392; 257/E21.396; 257/E21.551

(58) Field of Classification Search ........ 438/243–249, 438/386–392, 434, 425
See application file for complete search history.

(56) References Cited

U.S. PATENT DOCUMENTS

| 6,426,254 | B1 | 7/2002 | Kudelka et al. |
| 6,544,856 | B1 | 4/2003 | Morhard et al. |

*Primary Examiner*—Michael Lebentritt
*Assistant Examiner*—Kyoung Lee
(74) *Attorney, Agent, or Firm*—Slater & Matsil, L.L.P.

(57) ABSTRACT

The surface area of the walls of a trench formed in a substrate is increased. A barrier layer is formed on the walls of the trench such that the barrier layer is thinner near the corners of the trench and is thicker between the corners of the trench. A dopant is introduced into the substrate through the barrier layer to form higher doped regions in the substrate near the corners of the trench and lesser doped regions between the corners of the trench. The barrier layer is removed, and the walls of the trench are etched in a manner that etches the lesser doped regions of the substrate at a higher rate than the higher doped regions of the substrate to widen and lengthen the trench and to form rounded corners at the intersections of the walls of the trench.

20 Claims, 4 Drawing Sheets

SELECTIVE ETCHING TO INCREASE TRENCH SURFACE AREA

TECHNICAL FIELD

The present invention relates to semiconductor devices and, more particularly, to semiconductor devices having a trench structure.

BACKGROUND OF THE INVENTION

Semiconductor devices are employed in many applications. An important type of semiconductor device used in storage devices is the dynamic random access memory ("DRAM"). For example, the DRAM is used extensively for storage in computers. A basic DRAM cell typically includes a capacitor and a transistor formed in a semiconductor substrate. The capacitor stores a charge representing a data value, and the transistor enables the data value to be refreshed, read from the capacitor, or written to the capacitor.

Reducing the surface area of the capacitor and/or the transistor, also known as the footprint, allows more DRAM cells to be fit onto a chip. The increased number of DRAM cells results in greater storage capacity for the chip.

A known method of minimizing the surface area of a DRAM cell or other memory cell is to arrange the components vertically such that the components are disposed along two or more layers. Vertical memory cells occupy less surface area than planar memory cells, wherein the transistor and capacitor are side by side, or diagonal memory cells, wherein the capacitor is formed in the trench and the transistor is adjacent to the surface of the trench. As a result, the vertical memory cells may be placed much closer together than planar or diagonal cells.

A known way to accomplish such vertical construction is to provide a deep trench formed in a semiconductor substrate. The capacitor and/or the transistor are formed along the walls of the trench. As an example of a deep trench fabrication process, a pad oxide layer and a pad nitride layer are first deposited atop a silicon substrate, and then a hard mask layer is deposited atop the nitride layer. The hard mask layer and the pad nitride layer are then patterned and etched using a lithographic step, and the hard mask layer is then used to mask the etching of a deep trench.

Next, the hard mask layer is removed, and a doped glass layer is deposited along the walls and bottom of the trench as well as atop the nitride layer. A further step is then carried out to pattern and remove the doped glass from atop the nitride layer and from the walls of the upper portion of the trench. An oxide cap is then deposited over the remaining portion of the doped glass, as well as over the walls of the rest of the trench and atop the nitride layer, and an anneal step is carried out to drive dopants from the doped glass into the silicon substrate and form a buried plate. The oxide cap and the doped glass are then removed, and a thin dielectric layer is deposited along the sides of the trench.

The lower portion of the trench is filled with polysilicon to form the node conductor. The top surface of the device is then planarized to remove any portion of the polysilicon that is atop the nitride layer, and the polysilicon is recessed to the intended depth of the collar. The dielectric film is removed from the exposed upper portion of the trench, and the trench collar oxide layer is then deposited and directionally etched back to remove any portion of the trench collar oxide layer that is atop the nitride layer and on top of the node polysilicon. The remainder of the polysilicon layer is next deposited, and the device is again planarized to remove any polysilicon that is atop the nitride layer. The nitride layer protects the surrounding silicon during the polysilicon etch step.

The trench collar oxide is then recessed back preferably using a wet etch step. The oxide recess forms a divot at a location where the collar oxide is removed below the level of polysilicon fill. The divot is then filled by again filling the trench with polysilicon and then recessing the polysilicon to a desired level. The polysilicon region is subsequently doped in high temperature processing steps by the prior deposited polysilicon, and the dopant subsequently out-diffuses into the substrate to form a buried strap region.

To further increase the integration density of a DRAM, the surface area or footprint of the vertical DRAM cell is reduced. However, the reduced surface area of the DRAM cell also reduces the inner surface area of the DRAM cell trench and thereby decreases the capacitance of the trench capacitor. Because the sidewalls of the trenches are generally planar and limit the surface area of the trench, a process known as "bottle etching" may be carried out to increase the surface area of the lower part of the trench. The bottle etching is typically carried out using a wet etch that etches the walls and bottom of the trench in an isotropic manner. As an example of a process for forming a bottle-etched trench, a deep trench is etched, in the manner described above. The lower part of the trench is then filled, such as with a resist material, and the trench collar oxide layer is then grown along the exposed upper portions of the walls of the trench. The material in the lower portion of the trench is then removed, and the now exposed walls of the lower portion of the trench and the bottom of the trench are then etched, such as with a wet etchant, that etches the exposed surfaces of the substrate along the lower portion of the walls and along the bottom of the trench but which does not etch the collar oxide. This etching widens and deepens the lower portion of the trench in an isotropic manner so that the rectangular shape of the trench is generally retained. The resulting structure of the trench, when viewed in cross-section, has a shape commonly referred to as a "bottle shape". Examples of such bottle etching processes are described in U.S. Pat. No. 6,426,254 B2, issued Jul. 30, 2002 to Kudelka, et al. and titled "Method for Expanding Trenches by an Anisotropic Wet Etch", the disclosure of which is incorporated herein by reference.

Though the known bottle etching process increases the inner surface area of the trench and thereby increases the capacitance of the trench capacitor, the attained increase in capacitance may not be sufficient as the integration density of the DRAM is further increased because the spacing between adjacent trenches and other structures is reduced and may prevent the trench from being sufficiently widened.

It is therefore desirable to provide a deep trench structure in which the surface area of the trench wall is further increased in a more efficient manner.

SUMMARY OF THE INVENTION

According to a method of the invention, the surface area of the walls of the trench formed in a substrate is increased. The trench has a plurality of corners each formed at the intersection of a given two of the walls of the trench. A barrier layer, such as an oxide layer, is formed on the walls of the trench such that the oxide layer is thinner near the corners of the trench and is thicker between the corners of the trench. A dopant is introduced into the substrate through the oxide layer to form higher doped regions near the corners of the trench and lesser doped regions between the corners of the trench. The oxide layer is then removed. The walls of the trench are etched in manner that etches the lesser doped regions of the substrate at a higher rate than the higher doped regions of the substrate to widen and lengthen the trench and to form rounded corners at the intersections of the walls of the trench.

In accordance with this method, a collar layer may be formed on a first portion of each wall of the trench before the oxide layer is formed so that the oxide layer is formed only on a remaining portion of each wall of the trench, and the remaining above steps may be carried out only on the remaining portion of the walls of the trench. The first portion of the walls of the trench may be an upper portion of each wall of the trench that is near the surface of the substrate, and the remaining portion of the walls of the trench may be a lower portion of the walls of the trench. The oxide layer may be etched prior to the introduction of the dopant into the substrate so that the oxide layer is further thinned near the corners of the trench. This etching may be carried out using hydrofluoric acid (HF) wet etch.

The oxide layer may be formed on the walls of the trench using a thermal oxidation process. The thermal oxidation process may be carried out at a temperature of 700 to 900° C. The dopant may be introduced into the substrate by introducing a gas phase dopant species into the substrate. Alternatively, a doped layer may be deposited, and then the dopant species may be diffused into the substrate from the deposits layer. The walls of the trench may be etched using an isotropic etch process. The isotropic etch process may include a wet etch.

A further aspect of the invention includes a trench structure formed using the above method. In accordance with another embodiment of the present invention, a trench structure comprising the trench formed in a semiconductor substrate is provided. The trench has a plurality of walls and an indent is formed at the intersection of two of the plurality of walls, wherein a first width at a midpoint of the walls is wider than a second width at an intersection of two of the walls.

The foregoing aspects, features and advantages of the present invention will be further appreciated when considered with reference to the following description of the preferred embodiments and accompanying drawings.

BRIEF DESCRIPTION OF THE DRAWINGS

The object and other advantages of this invention are best described in the preferred embodiment with reference to the attached drawings that include.

DETAILED DESCRIPTION

The present invention alters the topography of the trench surface so that the trench surface area is increased and thereby increases the trench capacitance to improve the electrical storage capacity of the DRAM.

Figure 1A:
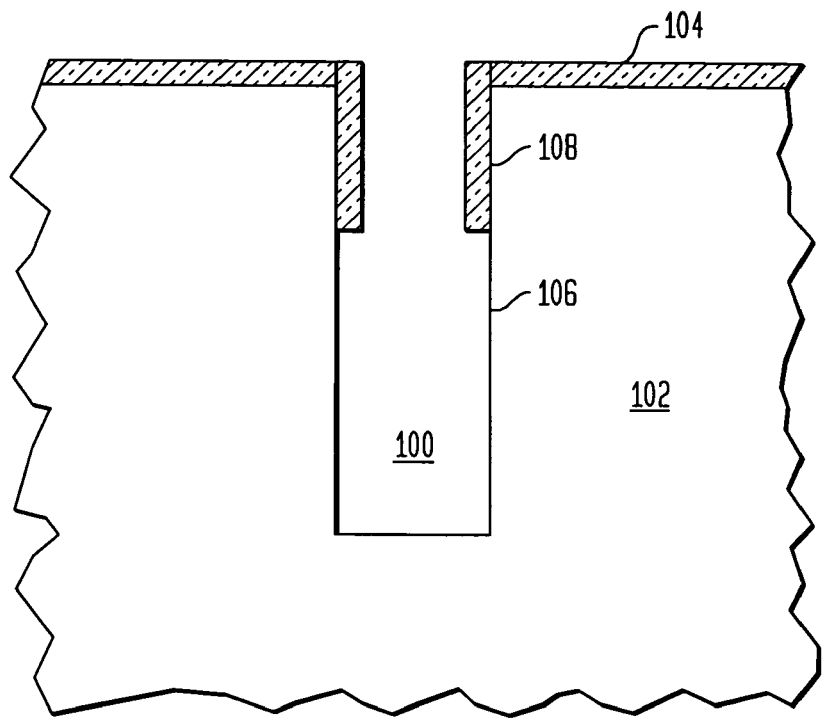
FIGS. 1A and 1B are diagrams showing cross-sectional views of a trench structure formed in a semiconductor substrate in a known manner.

FIG. 1A is a cross-sectional view of a trench 100 formed in a semiconductor substrate 102 formed using a known process. Typically, a pad layer 104 is formed on the surface of the substrate 102 and may be an oxide layer and/or a nitride layer. The pad layer serves to protect the surface of the substrate during subsequent etching steps. Then, a hard mask layer (not shown) is deposited over the pad layer 104, and the hard mask layer and the pad layer are patterned and etched using known lithographic steps to form one or more openings in the hard mask layer. Next, the hard mask layer is used to mask the etching of the substrate 102 to form the trench 100, and then the hard mask layer is removed. Typically, the etching of the trench is carried out using an anisotropic etch process, such as a reactive ion etch (RIE) process, to form a substantially rectangular opening having substantially vertical walls 106.

Then, a collar 108 is formed along the upper part of the walls of the trench in a known manner. As an example, the lower portion of the trench 100 may be filled with a resist or other material (not shown) which leaves exposed the upper part of the walls of the trench. One or more dielectric layers are then formed along the exposed portions of the walls of the trench as well as on the top surface of the substrate 102, the dielectric layer or layers are removed from the top surface of the substrate, and then the resist material is removed. The collar is preferably an oxide, a nitride, a combination of one or more oxides and one or more nitrides, or other materials. Optionally, one or more pad layers of oxide, nitride and/or polysilicon may be formed along the walls of the trench prior to the deposition of the resist or other material to protect the walls of the trench and are then removed from the walls of the lower part of the trench after the resist or other material is removed from the lower part of the trench.

As an alternative process for forming the collar, one or more oxide, nitride, or polysilicon pad layers are formed along the walls 106 of the trench 100, and an isotropic etch step is carried out to remove the pad material from the upper portion of the walls of the trench. Then, the collar 108 is formed on the upper part of the walls of the trench, and the liner materials are removed from the lower part of the walls of the trench using one or more wet etch steps.

Figure 1B:
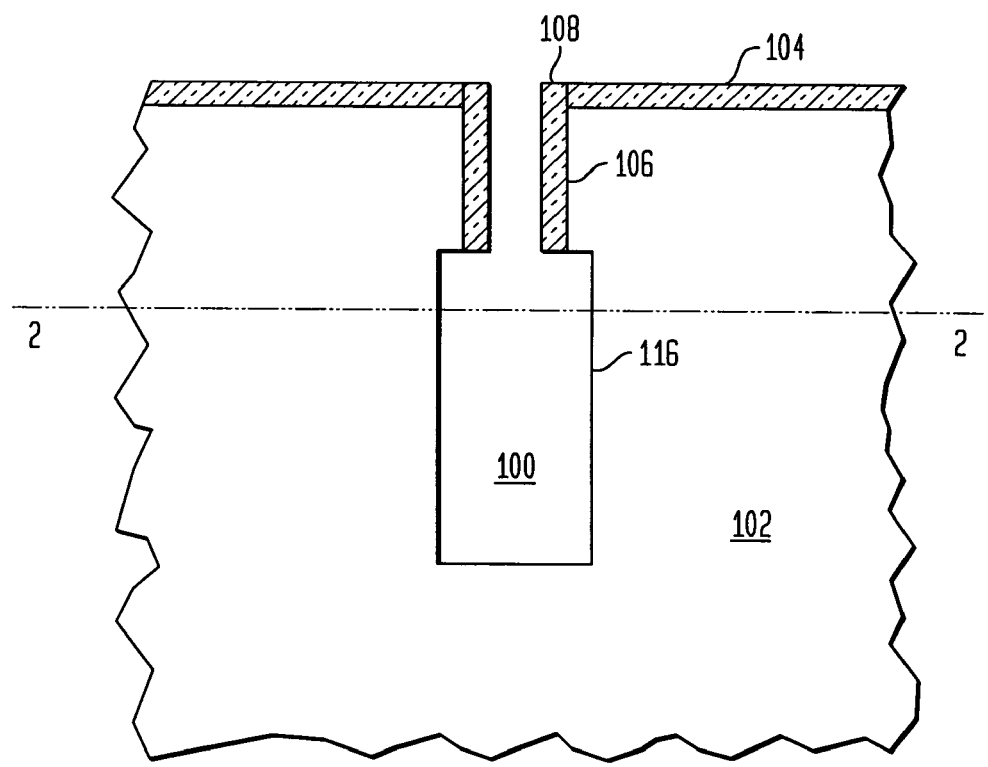

Then, as FIG. 1B shows, the lower part of the walls of the trench 100 are etched back using an isotropic etch, such as a wet etch step, that selectively etches the walls of the trench but leaves the collar substantially intact. The resulting trench has a "bottle shape", namely, the lower portion of the trench is wider than the upper portion of the trench. The walls 116 of the lower part of the trench are set further apart than the original walls 106 but maintain the substantially rectangular shape of the original trench. The increased surface area of the etched walls 116 allows for the formation of a trench capacitor having a greater surface area.

Figure 2:
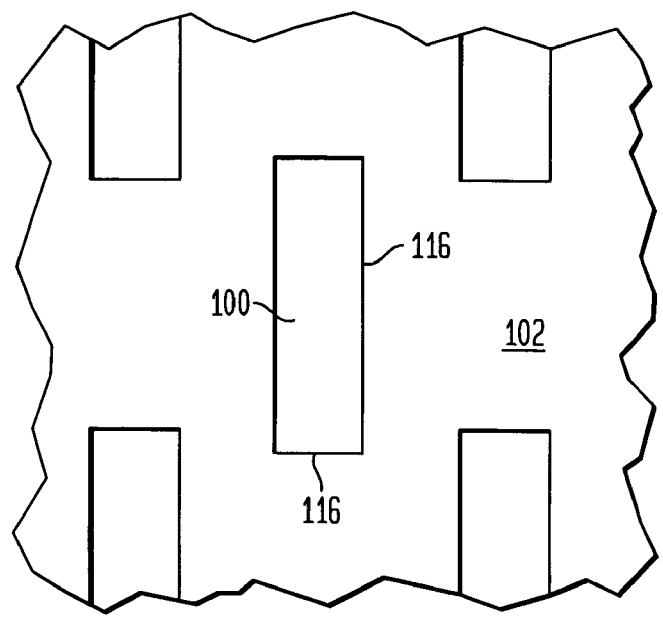
FIG. 2 is a diagram showing a cross-sectional top view of the trench of FIG. 1B taken along line 2—2.

FIG. 2 illustrates a cross-sectional top view of the bottle-etched portion of the trench shown in FIG. 1B taken along line 2—2 and shows the substantially rectangular shape of the bottle etched walls. As an example, when the substrate 102 is a silicon wafer having a [100] surface orientation, the walls 106 and 116 are oriented along crystal planes [110].

As the surface dimensions of DRAMs and other devices that use trenches decrease, the dimensions of the walls of the trench formed by the initial trench etch also decrease, requiring an increased bottle-etch to form larger area walls that maintain the desired trench capacitance. However, as the surface dimensions decrease, the spacing between the trenches also decreases, and thereby restricts the amount of bottle-etching that can be carried out before the doped regions of the capacitors of adjacent trenches are sufficiently close to create leakages and/or shorts between adjacent trenches.

The present invention addresses this problem by enlarging the surface area of the walls of the lower portion of the trench, and thereby increases the capacitance of the trench capacitor, while reducing the likelihood of leakage and/or shorts between the adjacent trench capacitors.

In accordance with the invention, a trench is formed having a collar along the upper part of the walls of the trench, such as is formed in the above manner, and then a thermal oxidation step is carried out to grow an oxide on the exposed, lower part of the walls of the trench. Preferably, the oxidation step is done at a lower temperature, e.g., between 700 to 900° C., than standard thermal oxidation. Ordinarily, such lower temperature thermal oxidation is not carried out because the thickness of the resulting thermally grown oxide is non-uniform and varies according to the mechanical stress of the deep trench walls. In the present invention, however, the non-uniformity of the lower temperature thermal oxidation is desired to form an oxide on the walls of the deep trench that is thinner near the corners than near the center of the trench walls.

Figure 3:
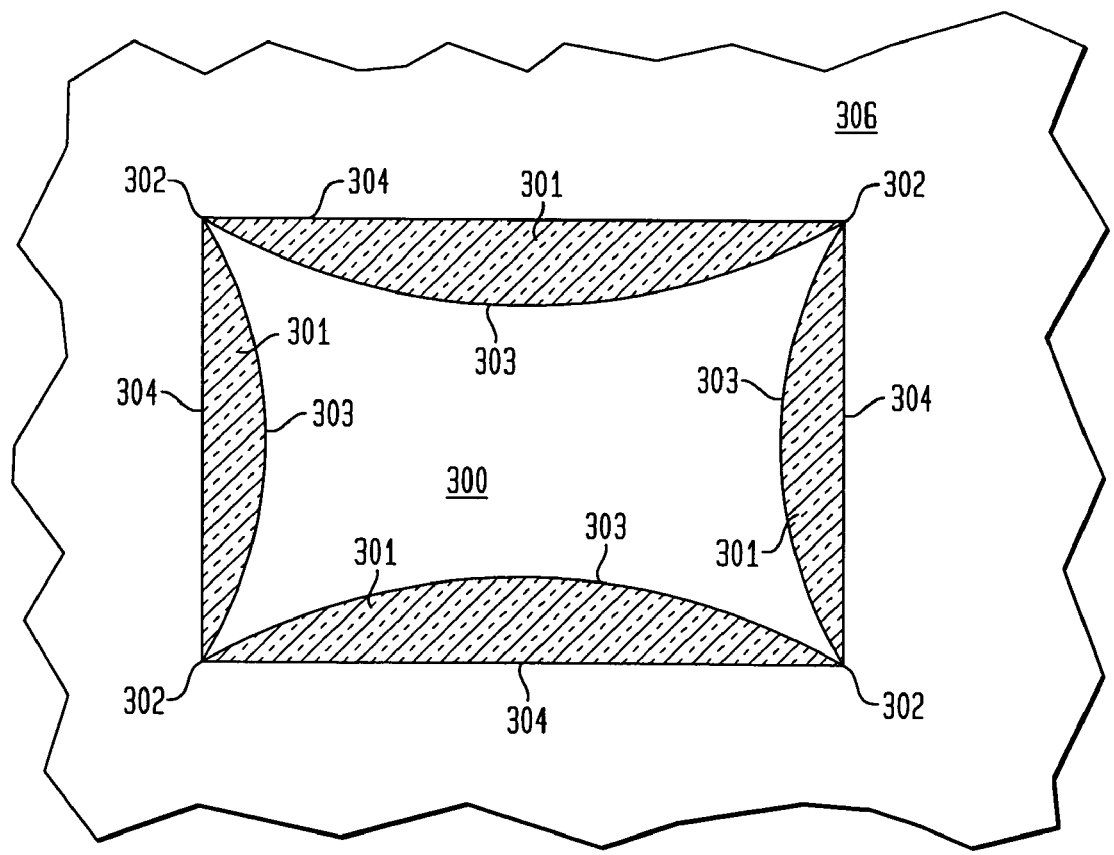
FIG. 3 is a diagram showing a cross-sectional top view of a trench after thermal oxidation according to a process of the invention.

FIG. 3 illustrates a cross-sectional top view of a trench 300 after the thermal oxidation step of the invention is carried out. A barrier layer, such as an oxide layer, is formed on the lower part of each of the trench sidewalls 304 and has a non-uniform thickness across the length of the trench walls. Specifically, the oxide layer 301 is thicker near the center of the walls, away from the trench corners, and is thinner near the trench corners 302. Optionally, a hydrogen fluoride (HF) wet etch may be subsequently performed to further thin the oxide layer 301 at the trench corners.

Figure 4:
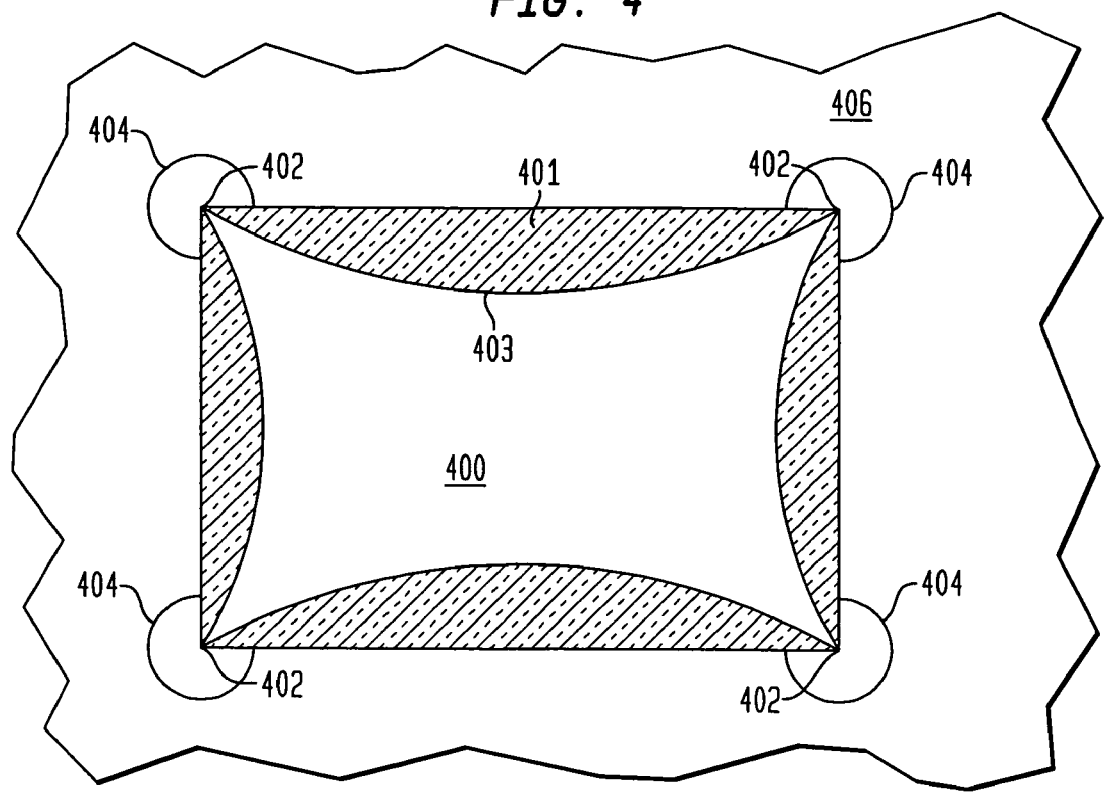
FIG. 4 is a diagram showing a cross-sectional top view of the trench of FIG. 3 after the introduction of dopants.

Then, a dopant is introduced through the oxide layer 301. The dopant may include arsenic, phosphorous, boron or other suitable dopant species. The dopant may be provided by a thermal process in which a gas phase dopant is introduced. Alternatively, a doped layer, such as arsenic doped glass (ASG) or borophosphosilicate glass (BPSG), may be deposited on the oxide layer and then thermally diffused into the walls. The introduction of dopants forms doped regions in the trench corners where the oxide layer is thinnest. FIG. 4 shows a cross-sectional top view of a trench 400 after the introduction of the dopants to form doped regions 404 at the corners 402.

Ordinarily, such as during buried plate doping, a reduced oxide thickness at the trench corners is avoided because of the resulting dopant penetration into the semiconductor region surrounding the trench collar. However, in accordance with the present invention, the thinner thermal oxide at the trench corners 402 and the resulting dopant penetration at the corners is desired. In fact, the thermal oxidation temperature is selected to maximize the thinning of the oxide 401 at the trench corners, as described above.

Figure 5:
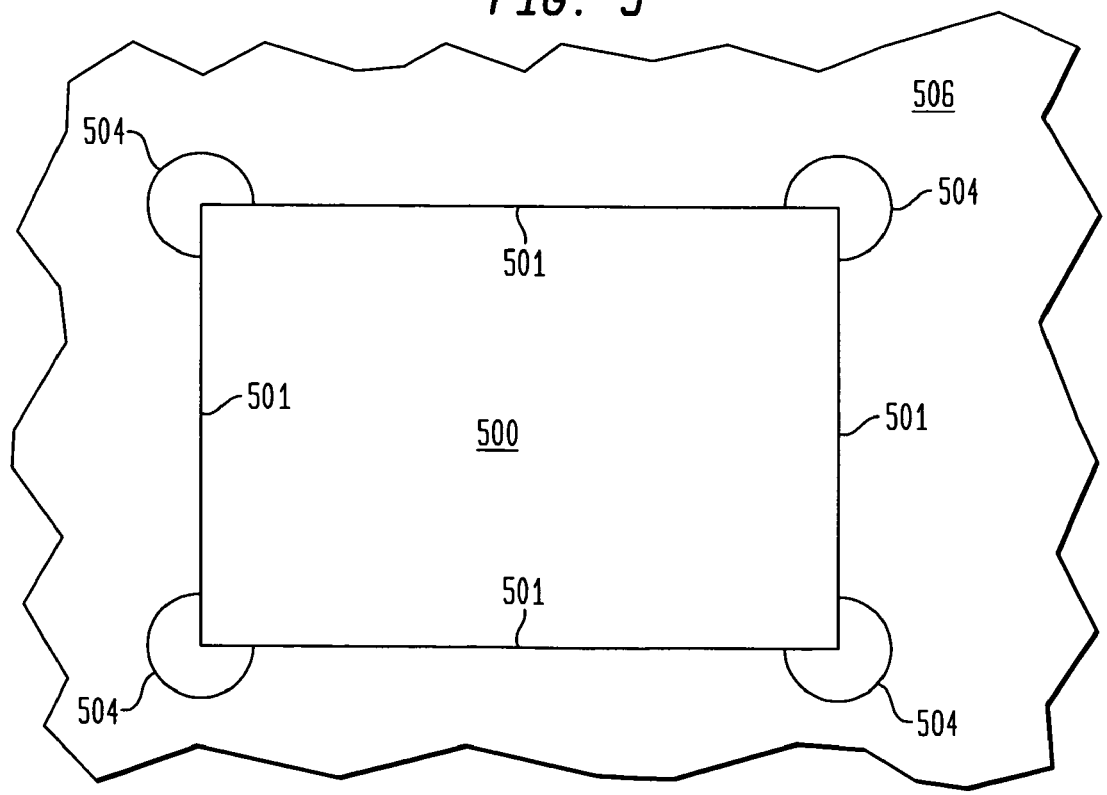
FIG. 5 is a diagram showing a cross-sectional top view of the trench of FIG. 4 after oxide removal.

Next, the thermally grown oxide is removed in a known manner. FIG. 5 shows a cross-sectional top view of a trench 500 after the oxide removal and shows the highly doped regions 504 present at the corners of the trench.

Then, a bottle etch process is carried out. The etch rate of the trench walls during the bottle etch is dependent on the doping level of the substrate, namely, the highly doped regions are etched more slowly whereas the lesser doped regions are etched more quickly. Thus, the trench walls are etched more rapidly in the areas between the highly doped regions 504 than at the corners of the trench.

Figure 6:
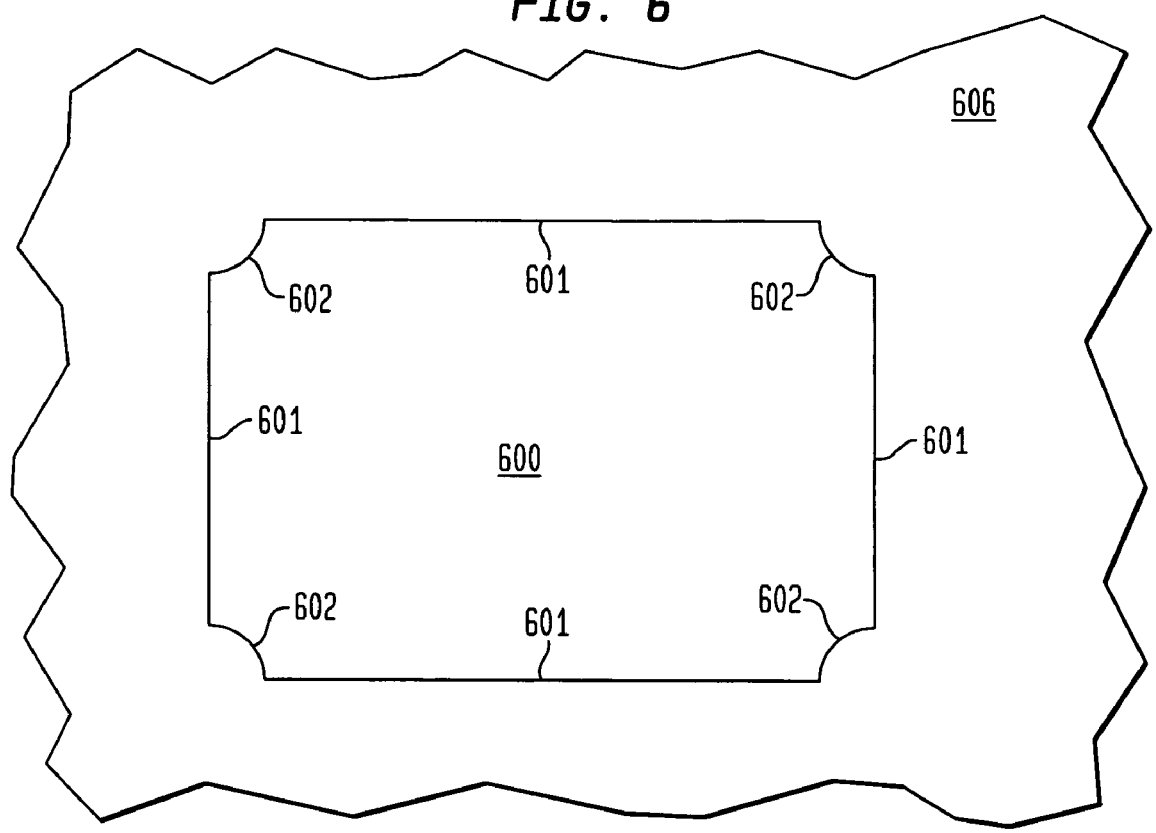
FIG. 6 is a diagram showing a cross-sectional top view of the trench of FIG. 5 after a bottle etch.

FIG. 6 illustrates a cross-sectional top view of a trench 600 after the bottle etch. The resulting trench sidewalls 601 are no longer planar but, instead, have protrusions 602 formed at the higher doped regions at the corners of the trench. As a result, the trench sidewalls have a greater surface area than is provided by conventional bottle etching.

Figure 7:
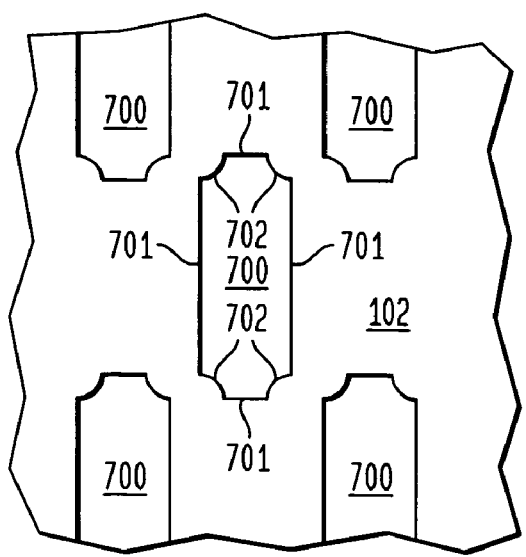
FIG. 7 is a diagram showing a cross-sectional top view of a portion of a substrate having a plurality of the deep trenches shown in FIG. 6.

FIG. 7 illustrates a portion of a semiconductor substrate in which a plurality of the trenches of FIG. 6 are formed. The trenches are shown along a cross-sectional top view taken below the substrate across the bottle-etched portion of the deep trenches. Each trench 700 includes sidewalls 701 having rounded corners 702. Advantageously, the rounded corners 702 provide the trenches 700 with a lower portion that is wider and longer than the lower portion of a trench that is conventionally bottle-etched, shown in FIG. 2, though the opening at the surface of the substrate may be the same size for both the trenches of FIG. 2 and the trenches of FIG. 7. Moreover, the rounded corners enable the trenches to be closer to each other without the presence of leakage or shorts between adjacent trenches.

Advantageously, the dopant selective etch can be controlled to obtain a desired trench surface area, and thus a desired trench capacitance by adjusting the dopant level and the bottle etch time. As a further advantage, the capacitance of the trench capacitor is increased with changing the size of the footprint. Alternatively, the footprint size of the trench may be reduced while maintaining the same trench capacitance.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A method of increasing the surface area of the walls of a trench formed in a substrate, the trench having a plurality of corners each formed at the intersection of a given two of the walls of the trench, said method comprising:

forming a barrier layer on the walls of the trench such that the barrier layer is thinner near the corners of the trench and is thicker between the corners of the trench;

introducing a dopant into the substrate through the barrier layer to form higher doped regions near the corners of the trench and lesser doped regions between the corners of the trench;

removing the barrier layer; and etching the walls of the trench in a manner that etches the lesser doped regions of the substrate at a higher rate than the higher doped regions of the substrate to widen and lengthen the trench.

2. The method of claim 1, further comprising:

forming a collar layer on a first portion of each wall of the trench before said step of forming the barrier layer so that the barrier layer is formed only on a remaining portion of each wall of the trench, and said introducing, removing and etching steps are carried out only on the remaining portion of the walls of the trench.

3. The method of claim 2, wherein the first portion of the walls of the trench is an upper portion of each wall of the trench that is near a surface of the substrate, and the remaining portion of the walls of the trench is a lower portion of each wall of the trench.

4. The method of claim 1, further comprising:
etching the barrier layer formed on the walls of the trench prior to said step of introducing a dopant into the substrate so that the barrier layer is further thinned near the corners of the trench.

5. The method of claim 4, wherein said etching the barrier layer step is carried out using a hydrofluoric acid (HF) wet etch.

6. The method of claim 1, wherein said step of forming the barrier layer on the walls of the trench is carried out using a thermal oxidation process.

7. The method of claim 6, wherein the thermal oxidation process is carried out at a temperature of 700 to 900° C.

8. The method of claim 1, wherein said step of introducing a dopant into the substrate includes introducing a gas phase dopant species into the substrate.

9. The method of claim 1, wherein said step of introducing a dopant into the substrate includes depositing a doped layer and then thermally diffusing a dopant species into the substrate from the deposited layer.

10. The method of claim 1, wherein said step of etching the walls of the trench is carried out using an isotropic etch process.

11. The method of claim 10, wherein the isotropic etch process includes a wet etch.

12. A trench structure formed in a substrate by a method, comprising:
patterning and etching an opening in a surface of the substrate to form a trench having a plurality of walls and having a plurality of corners each formed at the intersection of a given two of the walls of the trench;
forming a collar layer on an upper portion of each wall of the trench that is near the surface of the substrate;
forming a barrier layer on a remaining lower portion of the walls of the trench such that the barrier layer is thinner near the corners of the trench and is thicker between the corners of the trench;
introducing a dopant into the substrate through the barrier layer to form higher doped regions near the corners of the trench and lesser doped regions between the corners of the trench;
removing the barrier layer; and
etching the walls of the trench in a manner that etches the lesser doped regions of the substrate at a higher rate than the higher doped regions of the substrate to widen and lengthen the trench and to form rounded corners at each intersection of the walls of the trench.

13. The trench structure of claim 12, wherein said method further comprises:
etching the barrier layer formed on the walls of the trench prior to said step of introducing a dopant into the substrate so that the barrier layer is further thinned near the corners of the trench.

14. The trench structure of claim 13, wherein said etching step is carried out using a hydrofluoric acid (HF) wet etch.

15. The trench structure of claim 12, wherein said step of forming the barrier layer on the walls of the trench is carried out using a thermal oxidation process.

16. The trench structure of claim 15, wherein the thermal oxidation process is carried out at a temperature of 700 to 900° C.

17. The trench structure of claim 12, wherein said step of introducing a dopant into the substrate includes introducing a gas phase dopant species into the substrate.

18. The trench structure of claim 12, wherein said step of introducing a dopant into the substrate includes depositing a doped layer and then thermally diffusing a dopant species into the substrate from the deposited layer.

19. The trench structure of claim 12, wherein said step of etching the walls of the trench is carried out using an isotropic etch process.

20. The trench structure of claim 19, wherein the isotropic etch process includes a wet etch.

* * * * *